(12) United States Patent
Morisson

(10) Patent No.: US 7,394,421 B2
(45) Date of Patent: Jul. 1, 2008

(54) FAST ANALOGUE-TO-DIGITAL CONVERTER

(75) Inventor: Richard Morisson, Meylan (FR)

(73) Assignee: Atmel Grenoble S.A. (FR)

( * ) Notice: Subject to any disclaimer, the term of this patent is extended or adjusted under 35 U.S.C. 154(b) by 0 days.

(21) Appl. No.: 10/580,536

(22) PCT Filed: Nov. 22, 2004

(86) PCT No.: PCT/EP2004/053040

§ 371 (c)(1),
(2), (4) Date: Jan. 18, 2007

(87) PCT Pub. No.: WO2005/055431

PCT Pub. Date: Jun. 16, 2005

(65) Prior Publication Data

US 2007/0109167 A1    May 17, 2007

(30) Foreign Application Priority Data

Dec. 2, 2003  (FR) .................................. 03 14134

(51) Int. Cl.
*H03M 1/36* (2006.01)
(52) U.S. Cl. ..................... 341/159; 341/155; 341/154; 341/156
(58) Field of Classification Search .................. 341/154, 341/156, 155, 159; 327/65
See application file for complete search history.

(56) References Cited

U.S. PATENT DOCUMENTS

| | | | |
|---|---|---|---|
| 5,012,241 A * | 4/1991 | Kuttner | ...................... 341/120 |
| 5,396,131 A | 3/1995 | Miki et al. | |
| 5,539,406 A | 7/1996 | Kouno et al. | |
| 6,603,416 B2 * | 8/2003 | Masenas et al. | ............. 341/120 |
| 2003/0201928 A1 * | 10/2003 | McGowan | .................. 341/158 |

FOREIGN PATENT DOCUMENTS

DE    38 07 329 A    9/1989

* cited by examiner

*Primary Examiner*—Jean Bruner Jeanglaude
(74) *Attorney, Agent, or Firm*—Lowe Hauptman Ham & Berner, LLP

(57) ABSTRACT

The invention relates to fast analogue-to-digital converters having differential inputs and a parallel structure, comprising at least one network of N series resistors with value r and one network of N comparators. The series resistor network receives a reference voltage and is traversed by a fixed current $I_o$ and the row i (i varying from 1 to N) comparator essentially comprises a dual differential amplifier with four inputs; two inputs receive a differential voltage VS–VN to be converted, a third being connected to a row i resistor of the network, and a fourth input being connected to an N-i row resistor of the network. The resistor network is supplied by a variable reference voltage originating from a servoloop circuit which locks the voltage level of the middle of the resistor network at a voltage equal to the common mode voltage (VS–VSN)/2 present at the output of the sample-and-hold module.

4 Claims, 5 Drawing Sheets

FAST ANALOGUE-TO-DIGITAL CONVERTER

CROSS-REFERENCE TO RELATED APPLICATIONS

The present application is based on International application No. PCT/EP2004/053040 filed on Nov. 22, 2004, which in turn corresponds to French Application No. 03 14134 filed on Dec. 2, 2003, and priority is hereby claimed under 35 U.S.C. §119 based on these applications. Each of these applications are hereby incorporated by reference in their entirety into the present application.

FIELD OF THE INVENTION

The invention relates to fast analogue-to-digital converters with a parallel structure.

BACKGROUND OF THE INVENTION

The general principle of such a converter is as follows: a sample-and-hold module supplies a stabilized analogue voltage for a brief period of time which is the time necessary for conversion. A set of comparators in parallel compares this voltage to reference voltages defined by a series resistor network supplied by a constant current.

Comparator structures having differential inputs are preferably used because they eliminate the errors arising from common mode voltage fluctuations. In this case, the following structure is generally used: the voltage to be converted, in the form of a differential voltage Vin–VinN is applied to the input of the sample-and-hold module S/H which has a differential structure; the complementary differential outputs VS and VSN of the sample-and-hold module, representing the voltage to be converted (VS–VSN is equal to Vi–VinN) are applied to two networks of N precision resistors in series; the current $I_0$ in the networks is fixed by the identical current sources; the intermediate terminals between the resistors of the two networks are applied in pairs to the inputs of the N comparators in the following manner: the row i resistor of the first network (supplied by VS) and the N-i row resistor of the second network (supplied by the complementary voltage VSN) are connected to the inputs of the row i comparator $COMP_i$. The comparators switch in one direction or another depending on the level of the differential voltage VS–VSN, and it may be stated in summary that if the voltage VS–VSN corresponds to the switching threshold of the row i comparator, all the comparators of a row less than i will switch in one direction and all the comparators of a row greater than i will switch in the other direction; the state of the comparator outputs therefore provides a digital indication of the level of the input differential analogue voltage.

This arrangement is shown in FIG. 1.

For fast comparators, intended to provide a digital signal at a high sampling frequency and capable of receiving an analogue input voltage which may vary rapidly, the problem then arises of the response time constant of the structure which has just been described: the resistor network comprises numerous resistors since a high resolution is desired for the comparator. These resistors themselves have a parasitic capacitance and they are connected to comparators which also have parasitic capacitances. The combination of these resistors and of these parasitic capacitances results in transmission time constants between the outputs of the sample-and-hold module and the inputs of the comparators.

These time constants in particular have the following detrimental effect: since the resistor networks are crossed, the row i comparator receives on one input a voltage $VS-i.r.I_0$ after a delay which is broadly related to the time constant introduced by a set of i unit resistors with value r in series, while it receives on another input the voltage $VSN-(N-i).r.I_0$ after a delay which is related instead to the time constant introduced by a set of N-i resistors. It will therefore be understood that this causes no particular problem when i and N-i are nearly identical, but that it does cause a problem when i is close to zero or to N and N-i is close to N or zero: in these cases the time constants are in fact very different, which means that the comparator in question will receive one voltage level more rapidly on one input than on the other. Over this time interval it may quite simply provide a false indication. There is therefore a risk that those comparators which are on the borderline between switching in one direction or in the other will provide an incorrect indication. The higher the resolution or the conversion frequency, the greater the susceptibility to this error.

SUMMARY OF THE INVENTION

The aim of the present invention is as far as possible to remedy this drawback.

The present invention provides to this end an analogue-to-digital converter having differential inputs and a parallel structure, comprising at least one network of N series resistors with value r and one network of N comparators, characterized in that
- the series resistor network receives a reference voltage (VH) and is traversed by a fixed current $I_0$;
- the row i comparator (i varying from 1 to N) essentially comprises a dual differential amplifier with four inputs, two inputs receiving a differential voltage VS–VN to be converted, a third being connected to a row i resistor of the network, and a fourth input being connected to an N-i row resistor of the network, the dual differential amplifier supplying a voltage representing a difference of the form $(VS-VSN)-(N-2i)r.I_0$, and the comparator switching in one direction or the other depending on the level of the voltage VS–VSN and on the row i of the comparator when said difference changes sign.

In practice, the dual differential amplifier with four inputs is composed of two single differential amplifiers, the outputs of which are connected in parallel, each of them receiving, on the one hand, one of the two input differential voltages and, on the other hand, one of the two voltages originating from the resistor network.

In an advantageous embodiment, the resistor network is supplied by a variable reference voltage originating from a servoloop circuit which locks the voltage level of the middle of the resistor network at a voltage equal to the common mode voltage (VS–VSN)/2 present at the output of the sample-and-hold module. This voltage equal to the common mode voltage is preferably taken at the output of a buffer amplifier, the current and voltage characteristics of which reproduce the characteristics of a differential amplifier which supplies the analogue voltages to be converted VS and VSN. This buffer amplifier thus in principle reproduces the common mode characteristics of the output amplifier of the sample-and-hold module which supplies the analogue signal to be converted.

In another advantageous embodiment, the servoloop circuit supplies a variable reference voltage to the resistor network and to another resistor network similar to the first, locking being performed starting from a voltage taken from the middle of the other resistor network.

BRIEF DESCRIPTION OF THE DRAWINGS

Other features and advantages of the invention will become apparent on reading the detailed description which follows and which is provided with reference to the appended drawings in which:

DETAILED DESCRIPTION OF THE DRAWINGS

Figure 1:
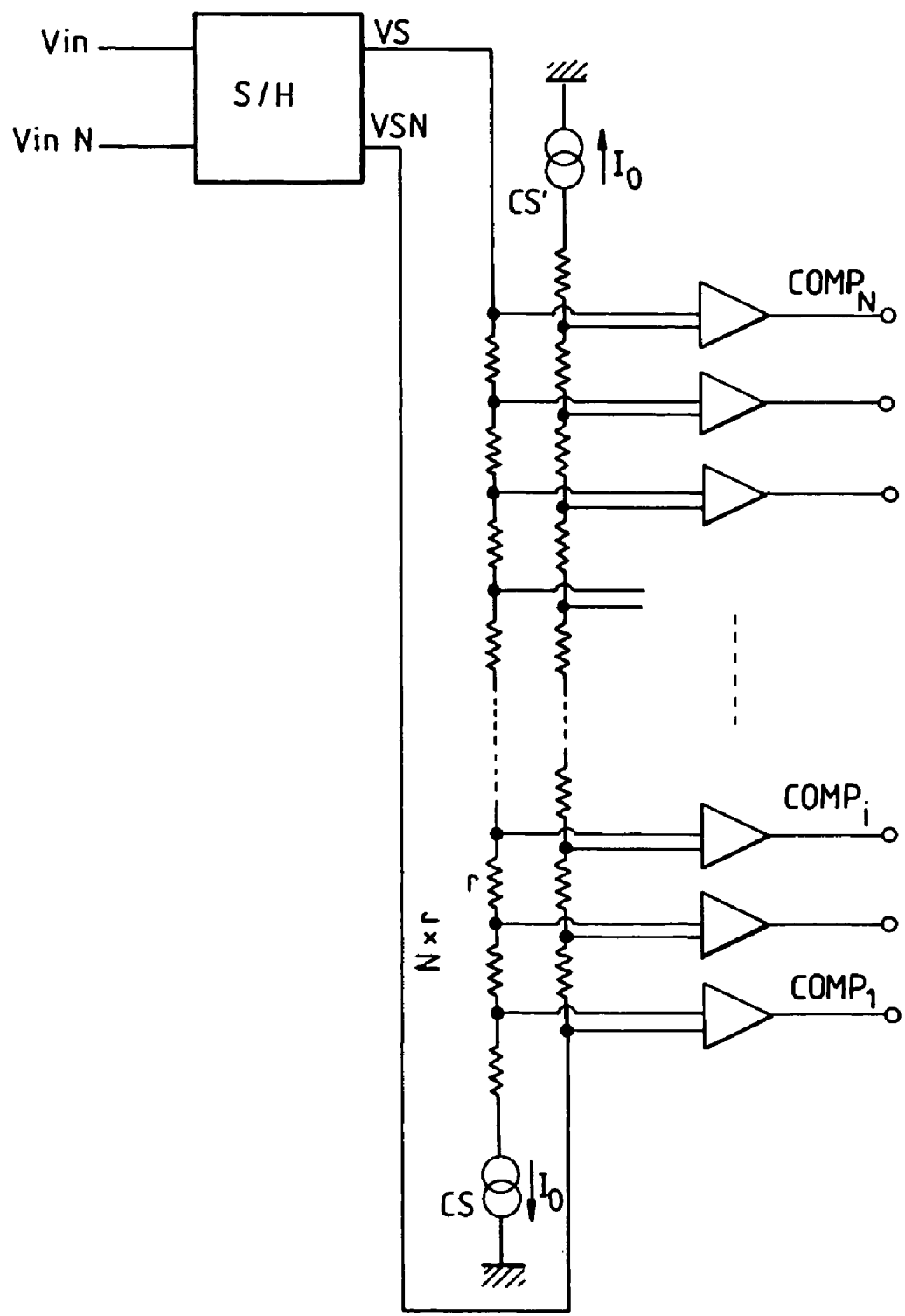
Figure 2:
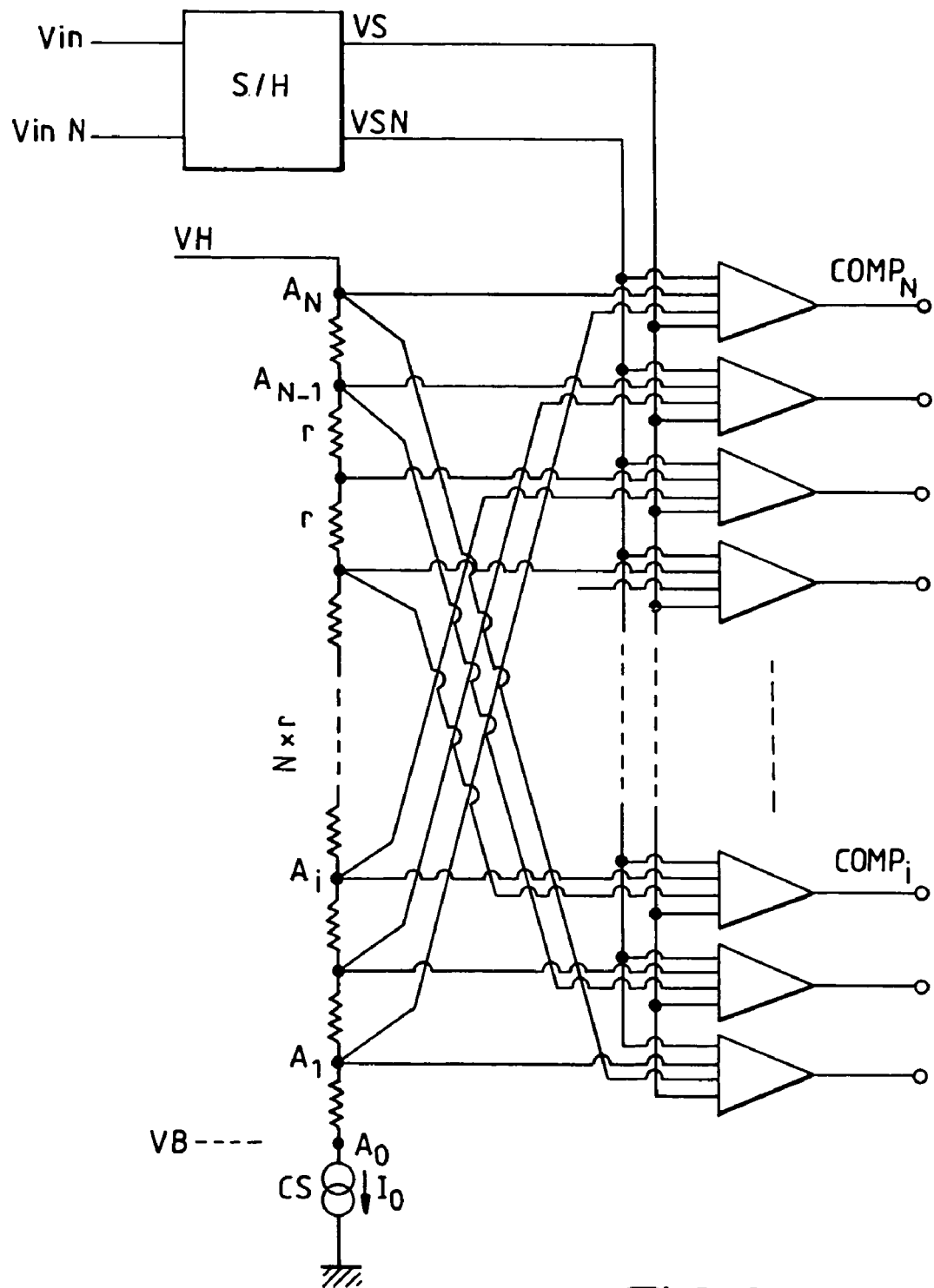
Figure 3:
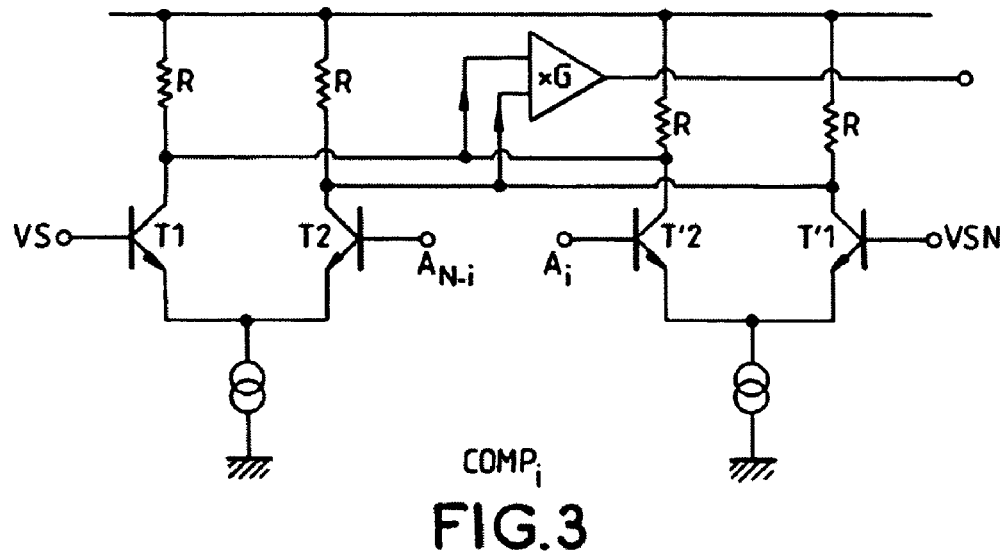
Figure 5:
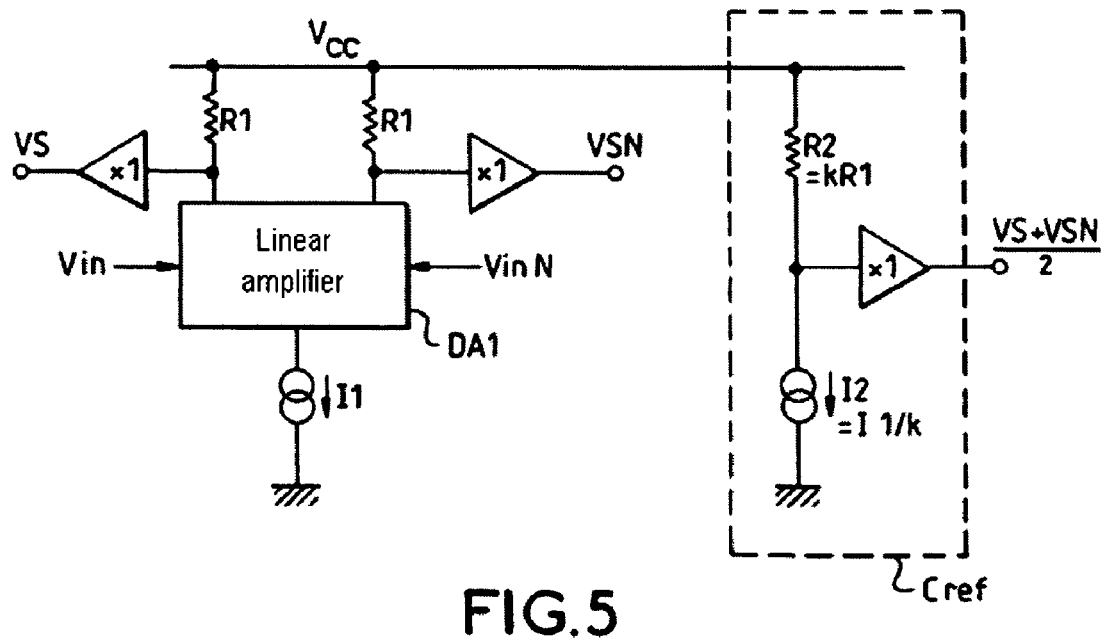
Figure 4:
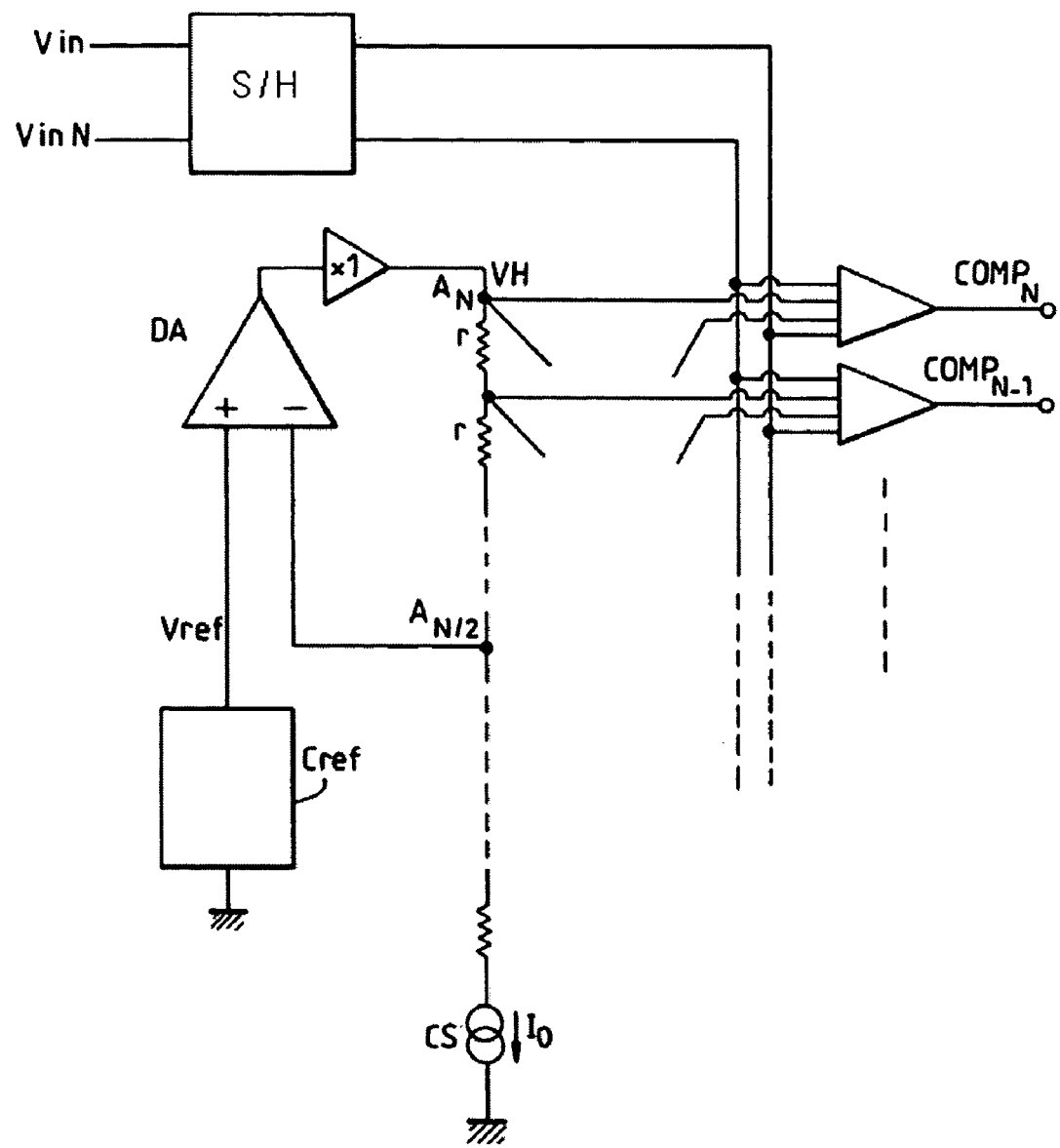
Figure 6:
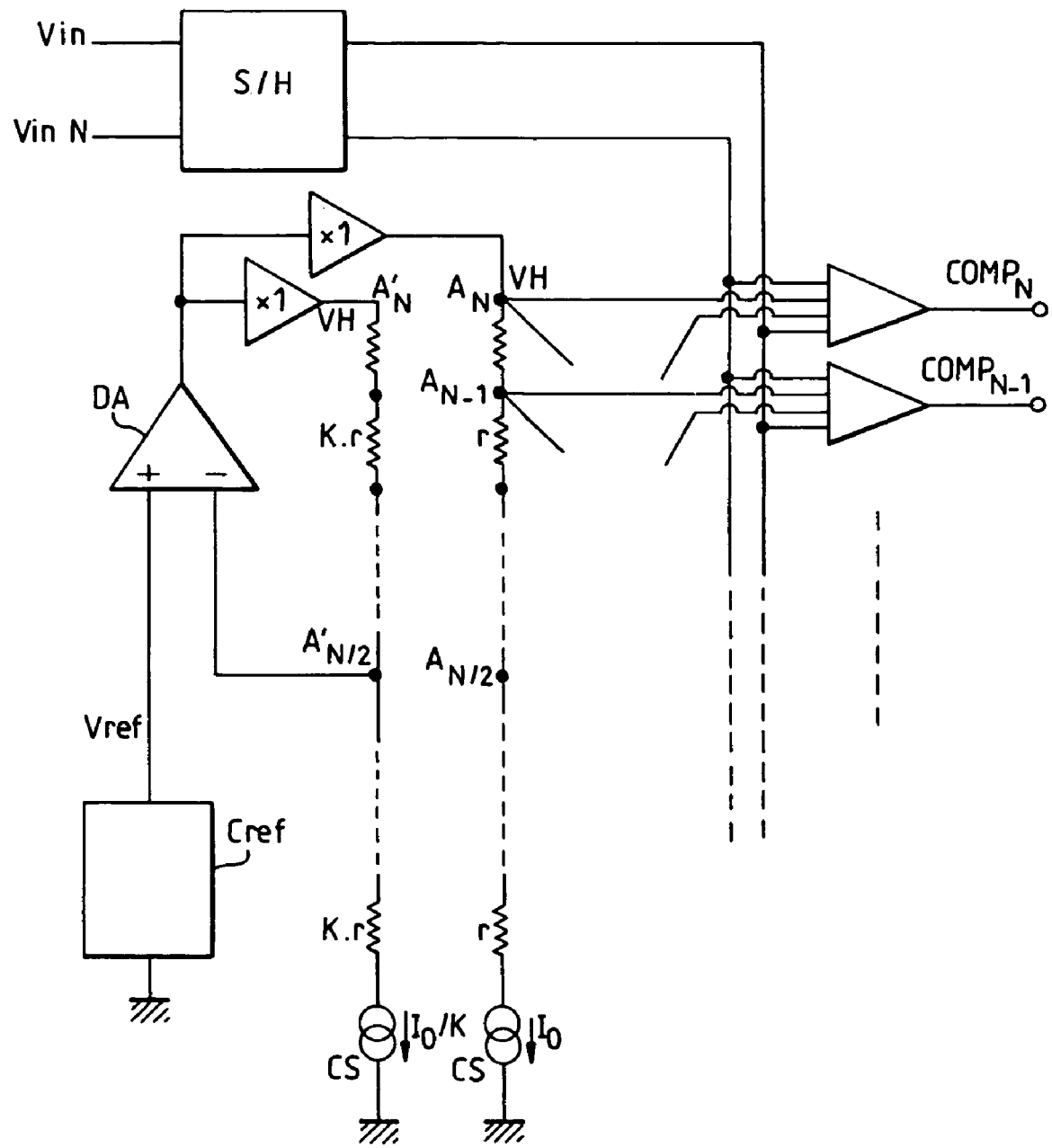

FIG. 1, already described, shows the structure of a prior art fast differential analogue-to-digital converter;

FIG. 2 shows the structure of a converter according to the invention;

FIG. 3 shows the diagram of a unit comparator used in the diagram of FIG. 2;

FIG. 4 shows a variant embodiment in which a voltage taken from a midpoint of the resistor network is used to lock the voltage applied to this network;

FIG. 5 shows a reference cell configured so as to supply a reference voltage equal to the common mode voltage of the sample-and-hold module;

FIG. 6 shows another variant embodiment in which the voltage used for locking is taken from a mirror network of the first resistor network.

FIG. 2 shows the general structure of the converter according to the invention. The output of the sample-and-hold module is a differential output supplying a voltage VS and a complementary voltage VSN, which are stable for the duration of conversion of the current sample.

A network of N identical resistors with value r in series is supplied with a constant current with value $I_0$ from a high voltage VH; a current source CS in series with the network defines the value of the constant current $I_0$. If the row of a resistor with value r in the series set is denoted i, with i varying from 1 to N−1, $A_i$ is the node connecting the row i resistor and the row i+1 resistor; $A_0$ is the node connecting the current source CS to the row 1 resistor; VH is the potential of the node $A_N$.

The potential may be calculated at any node of the resistor network from VH, r and $I_0$.

The potential of node $A_i$ is $VH-(N-i).r.I_0$. The potential of node $A_{N-i}$ is $VH-i.r.I_0$.

A network of N dual comparators $COMP_i$ with row i=1 to N receives, on the one hand, the voltages present at the nodes of the resistor network and, on the other hand, the voltage VS and the voltage VSN. More specifically, the row i dual comparator receives on a first group of inputs, on the one hand, the voltage VS and, on the other hand, the voltage present at the row N−i node $A_{N-i}$, and it receives on a second group of inputs, on the one hand, the complementary voltage VSN and, on the other hand, the voltage present at the row i node $A_i$.

A dual comparator is here essentially taken to mean a dual differential amplifier, the outputs of which are connected to one another in crossed manner as will be explained below; the dual differential amplifier simply comprises two single differential amplifiers, the first amplifier receiving VS and node $A_{N-i}$, the second receiving VSN and node $A_i$. The outputs of the amplifiers are combined to act as an adder; crossing the outputs creates a difference, such that the outputs supply a differential voltage which represents, with a coefficient corresponding to the gain of the amplifier, the difference between the voltage differences applied to the inputs taken in pairs:

$VS-(VH-i.r.I_0)$ and $VSN-\{VH-(N-i).r.I_0\}$

The differential output of the dual amplifier then represents:

$VS-VSN-(N-2i).r.I_0$

This output, optionally reamplified by a high-gain amplifier, makes it possible to convert the sign of the difference $VS-VSN-(N-2i).r.I_0$ into a logic level.

All the comparators for which VS−VSN is greater than $(N-2i).r.I_0$ switch in one direction, all the comparators for which VS−VSN is less than $(N-2i).r.I_0$ switch in the other direction.

The converted digital value is determined by the row of the comparator, such that all the comparators below this row are in a first state and all the comparators above this row are in a second state.

The number of resistors r provides the resolution of the comparator. Adjustment of the current $I_0$ makes it possible to adjust the conversion range, i.e. the maximum value of VS−VSN which may be converted with the precision defined by the number of resistors r.

In order to minimize the effects due to common mode voltages and the fluctuations thereof, it is ensured that the voltage at the middle of the resistor network, i.e. in practice the voltage present at node $A_{N/2}$, is equal to the common mode voltage of the outputs of the sample-and-hold module:

$VH-.r.I_0.N/2=(VS+VSN)/2$

VH is thus set correspondingly and it will be seen below that it may be set on the basis of a locking operation.

FIG. 3 shows the detailed composition of a dual differential amplifier with combined crossed outputs used in the comparators $COMP_i$ of FIG. 2. The transistors shown are bipolar transistors but they may also be MOS transistors.

It comprises two single high-gain linear differential amplifiers, which are identical and of conventional structure, i.e. with two symmetrical branches supplied by the current from a single constant current source, each branch comprising a transistor in series with a load resistor R. The bases of the transistors are the inputs of the amplifiers. The first amplifier receives VS at the base of the first transistor T1 and node $A_{N-1}$ at the base of the second transistor T2. The second amplifier receives VSN at the base of the first transistor T'1 and node $A_i$ at the base of the second transistor T'2. The outputs are fitted as an adder, but crossed: the output constituted by the collector of T1 is connected to the output constituted by the collector of T'2 to constitute a first output of the dual differential amplifier, and reciprocally the collectors of T'1 and T2 are connected to constitute a second output of the dual differential amplifier; the output of the comparator is made up of one of these outputs, for example the collector of T1 and T'2, or alternatively of an output of a high-gain amplifier, the inputs of which receive the outputs of the dual amplifier.

FIG. 4 shows a variant embodiment of the converter, in which the voltage VH is determined automatically by a circuit locked on the common mode voltage of the sample-and-hold module S/H.

A high-gain differential amplifier DA is used, having a first input connected to node $A_{N/2}$ representing the middle of the resistor network and a second input connected to the output of a cell Cref for determining the common mode voltage. The output of the differential amplifier supplies the voltage VH, either directly, or by means of a unit-gain buffer amplifier with high input impedance and low output impedance; a resistor may also be provided between the output of the buffer amplifier and the terminal $A_N$.

The voltage VH at the terminal $A_N$ locks automatically such that the voltage difference at the input of the amplifier is virtually zero. The voltage VH therefore assumes a value such that the voltage of node $A_{N/2}$ is equal to the output voltage of the reference cell.

The cell Cref must supply a voltage equal to the common mode voltage (VS+VN)/2 prevailing at the output of the sample-and-hold module. To this end, the cell simply comprises a buffer amplifier stage made up of elements which are geometrically similar to those of the output stage of the sample-and-hold module.

FIG. 5 shows the composition of the output stage of the sample-and-hold module and the reference cell. The output stage of the sampler may be represented on the basis of a linear differential amplifier DA1 loaded by two resistors R1 and supplied by a common current source of value I1. Unit-gain buffer amplifiers are connected to the differential outputs of the amplifier; these buffer amplifiers supply the voltages VS and VSN. The reference cell, supplied by the same voltage Vcc as the sample-and-hold module, quite simply makes use of a series assembly of a resistor R2 and a current source of value I2, and a unit-gain buffer amplifier identical to those which define the outputs of the sample-and-hold module. The resistor R2 is equal to k times (k arbitrary, greater than 1 to limit consumption) the load resistor R1 of the output stages of the sample-and-hold module; the current source I2 is equal to 1/k times the current source I1 of the differential stage which constitutes the differential output stage of the sample-and-hold module.

This cell supplies a voltage Vref which is equal to the common mode voltage (VS+VSN)/2 of the sample-and-hold module.

FIG. 6 shows another variant embodiment of the converter, in which locking of the supply voltage VH of the resistor network is effected on the basis of a second resistor network, similar to the first. This second network is preferably made up of resistors of value K.r and is traversed by a current $I_0/k$ in order to consume less current. The voltage applied to the end of the second network (node $A'_N$ of the second network) is the same voltage VH as that which is applied to node $A_N$ of the first network. It is applied by a buffer amplifier identical to that which applies the voltage VH to the first network, from the output of the differential amplifier DA which controls locking. This differential amplifier, instead of receiving the midpoint $A_{N/2}$ of the first network, receives the midpoint $A_{N/2}$ of the second network. The voltages at all the nodes of the second network are identical to those at the corresponding nodes of the first network and consequently locking on the basis of node $A'_{N/2}$ is identical to locking on the basis of node $A_{N/2}$.

The advantage of this arrangement is that locking is not disrupted by variations in voltage levels which could appear at node $A_{N/2}$ by capacitive influence or the influence of the semiconductor substrate in the event of major changes in the voltage to be converted.

An analogue-to-digital converter with a resistor network has thus been described which avoids the negative influence of time constants due to issues of network capacitance and resistance such as was the case in the diagram of FIG. 1. The resistor network in fact no longer receives the voltage to be converted but a fixed voltage (apart from the fluctuations in common mode level which are of only secondary importance).

The converter according to the invention does, however, remain a differential converter, which exhibits advantages in particular with regard to eliminating the distortion due to the even harmonics of the voltages to be converted.

Finally, given that the parasitic capacitances of the resistor network are no longer of the first order, the resistor network may be produced from larger resistors in the integrated circuit, which makes it possible for them to be produced with greater precision. Typically, while it was previously necessary to produce resistors of the order of 1 to 2 micrometers in width in order to minimize their parasitic capacitances, resistors of the order of 200 to 600 micrometers in width may now be used.

The invention claimed is:

1. An analogue-to-digital converter having differential inputs and a parallel structure, comprising at least one network of N series resistors with value r and one network of N comparators wherein:

the series resistor network receives a reference voltage and is traversed by a fixed current $I_o$;

the row i, i varying from 1 to N, comparator comprises:

a dual differential amplifier with four inputs, two inputs receiving a differential voltage to be converted, said differential voltage provided by a sample-and-hold module, a third input being connected to a row i resistor of the network, and a fourth input being connected to an N-i row resistor of the network, the dual differential amplifier supplying a voltage representing a difference of the form $(VS-VSN)-(N-2i)r.I_o$, and the comparator switching in one direction or the other depending on the level of the voltage and on the row i of the comparator when said difference changes sign, and wherein the resistor network is supplied by a variable reference voltage originating from a servoloop circuit which locks the voltage level of the middle of the resistor network at a voltage equal to the common mode voltage (VS−VSN)/2 present at the output of the sample-and-hold module, said servoloop circuit comprising an amplifier having an input connected to a mid-point of the resistor network.

2. The converter as claimed in claim 1, wherein the dual differential amplifier with four inputs is composed of two single differential amplifiers, the outputs of which are connected in parallel, each of them receiving, on the one hand, one of the two input differential voltages and, on the other hand, one of the two voltages originating from the resistor network.

3. An analogue-to-digital converter having differential inputs and a parallel structure, comprising at least a first network of N series resistors with value r and one network of N comparators, wherein the first resistor network receives a reference voltage (VH) and is traversed by a fixed current $1_o$;

the row i (i varying from 1 to N) comparator essentially comprises a dual differential amplifier with four inputs, two inputs receiving a differential voltage VS-VN to be converted, said differential voltage provided by a sample-and-hold module, a third input being connected to a row i resistor of the network, and a fourth input being connected to an N-i row resistor of the network, the dual differential amplifier supplying a voltage representing a difference of the form $(VS-VSN) - (N-2i)r.l_0$, and the comparator switching in one direction or the other depending on the level of the voltage VS-VSN and on the row i of the comparator when said difference changes sign, and wherein the first resistor network is supplied by a variable reference voltage originating from a servoloop circuit which locks the voltage level of the middle of the resistor network at a voltage equal to the common mode voltage (VS-VSN)/2 present at the output of the sample-and-hold module, said servoloop circuit comprising an amplifier having an input connected to a mid-point of another resistor network similar to the first, the second network also receiving said variable reference voltage from the servoloop circuit.

4. The converter as claimed in claim 3, wherein the dual differential amplifier with four inputs is composed of two single differential amplifiers, the outputs of which are connected in parallel, each of them receiving, on the one hand, one of the two input differential voltages and, on the other hand, one of the two voltages originating from the first resistor network.

* * * * *